United States Patent [19]

Emmons et al.

[11] Patent Number: 4,751,565
[45] Date of Patent: Jun. 14, 1988

[54] MICROPROCESSOR CONTROLLED DIGITAL GENLOCK

[75] Inventors: Patten A. Emmons; Bruce J. Penney; Timothy W. Slate, all of Portland, Oreg.

[73] Assignee: Tektronix, Inc., Beaverton, Oreg.

[21] Appl. No.: 915,858

[22] Filed: Oct. 6, 1986

Related U.S. Application Data

[63] Continuation of Ser. No. 722,942, Apr. 12, 1985, abandoned.

[51] Int. Cl.$^4$ .............................................. H04N 9/45
[52] U.S. Cl. ..................................... 358/19; 358/13; 358/25
[58] Field of Search ................... 358/13, 19, 21, 23, 358/25; 375/111, 118

[56] References Cited

U.S. PATENT DOCUMENTS

| | | | |
|---|---|---|---|
| 4,291,332 | 9/1981 | Kato et al. ............................ | 358/150 |
| 4,404,583 | 9/1983 | Tatami .................................. | 358/13 |
| 4,454,530 | 6/1984 | Yoshinaka et al. ................... | 358/10 |
| 4,470,064 | 9/1984 | Michener ............................... | 358/10 |
| 4,491,862 | 1/1985 | Flamm ................................... | 358/19 |
| 4,527,145 | 7/1985 | Haussmann et al. .................. | 358/19 |
| 4,538,172 | 8/1985 | Iwase et al. ............................ | 358/13 |
| 4,541,009 | 9/1985 | Rougeolle et al. ................... | 358/13 |
| 4,544,944 | 10/1985 | Chin .................................... | 358/28 |
| 4,556,900 | 12/1985 | Willis .................................... | 358/13 |
| 4,558,348 | 12/1985 | Bolger et al. ......................... | 358/13 |

FOREIGN PATENT DOCUMENTS 122297 7/1984 Japan ..................................... 358/19

Primary Examiner—John W. Shepperd
Attorney, Agent, or Firm—Francis I. Gray; John Smith-Hill

[57] ABSTRACT

A digital phase-locked loop maintains a clock signal in a predetermined phase and frequency relationship with an input video signal having a repeating signal element, such as horizontal sync pulses and/or color burst signals. The clock signal is generated by a voltage controlled oscillator, the frequency of which depends on an input digital control signal. The input video signal is sampled by an analog-to-digital converter at the clock signal frequency to generate a succession of digital words representing the amplitudes of successive samples. A portion of the successive digital words is stored in a memory, the access to which is controlled so that the samples representing the repeating signal element are stored and then read out for processing by a microprocessor. The digital control signal from the microprocessor which is input to the oscillator represents the difference between the actual phase and frequency relationship between the clock signal and the repeating signal element and the desired predetermined phase and frequency relationship so that the oscillator frequency is varied to attach such predetermined phase and frequency relationship.

5 Claims, 2 Drawing Sheets

MICROPROCESSOR CONTROLLED DIGITAL GENLOCK

This is a continuation of application Ser. No. 722,942 filed Apr. 12, 1985 and now abandoned.

This invention relates to digital phase-locked loops.

BACKGROUND OF THE INVENTION

In a known type of digital television test signal generator, such as the Tektronix 1910, the various test signals are inserted into the composite color video signal in timed relationship to the sync and burst of the video signal. The test signals themselves are generated by reading digital data out of ROM under control of a clock signal at $4f_{SC}$, where $f_{SC}$ is the color subcarrier frequency (3.58 MHz in the case of the NTSC signal format), and converting the digital data to analog form by a digital-to-analog converter (DAC). In order for the test signals to be inserted in timed relationship to the burst of the video signal, the $4f_{SC}$ clock signal must have a fixed phase relationship to the color burst. Generally speaking, it is desired that the clock signal be adjustable in phase relative to the color burst, e.g. in order to allow for pre-compensation for system delays and to accommodate test signals that are encoded in ROM on different modulation axes. In the case of the Tektronix 1910 test signal generator, the desired phase relationship is established using an analog phase-locked loop. Thus, a conventional sync separator identifies sync of the video signal and opens a window during burst time while the video signal is applied to a phase detector. The analog output of the phase detector is applied to the control input of a voltage controlled oscillator (VCO), and the output of the VCO is fed back to the other input of the phase detector. Thus, the phase detector generates an error signal representative of the difference in phase between the burst and the output of the VCO, and the output of the VCO is thereby brought into phase with the burst. The VCO is used to generate the $4f_{SC}$ signal. The operation of bringing the $4f_{SC}$ signal into phase with burst is known as genlocking.

Among the disadvantages of using a conventional analog phase-locked loop are that an analog phase-locked loop requires calibration and drifts with time and temperature.

SUMMARY OF THE INVENTION

In a preferred embodiment of the invention, an input analog signal, such as an NTSC video signal, having a signal element that repeats at a first, nominally fixed frequency (the first positive-going zero crossing of burst, repeating at line rate) is used to generate a signal at a second, higher frequency ($4f_{SC}$, for example) and having a predetermined phase relationship to the repetitive signal element of the input signal. This is accomplished by using a programmable oscillator to generate a clock signal at a frequency that depends on the value represented by a control word applied to the oscillator, and using the clock signal to establish the sample times for an analog-to-digital converter (ADC), whereby a succession of digital words representing the amplitude of the analog input signal at the time of successive clock signals is generated. The digital words are then analyzed to identify where, in the succession of digital words, the signal element occurs and to determine the phase angle of the clock cycle at which the signal element occurs. This phase information is used to generate the control word for the programmable oscillator and to establish the desired predetermined phase relationship between the clock signal and the signal element of the input signal.

The digital phase-locked loop that is thus provided avoids the above-mentioned disadvantages of an analog phase-locked loop, and in a color video application in which the repetitive signal element is a positive-going zero crossing of burst, enables a measure of SC-H (subcarrier to horizontal sync) phase to be provided without use of additional circuitry.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
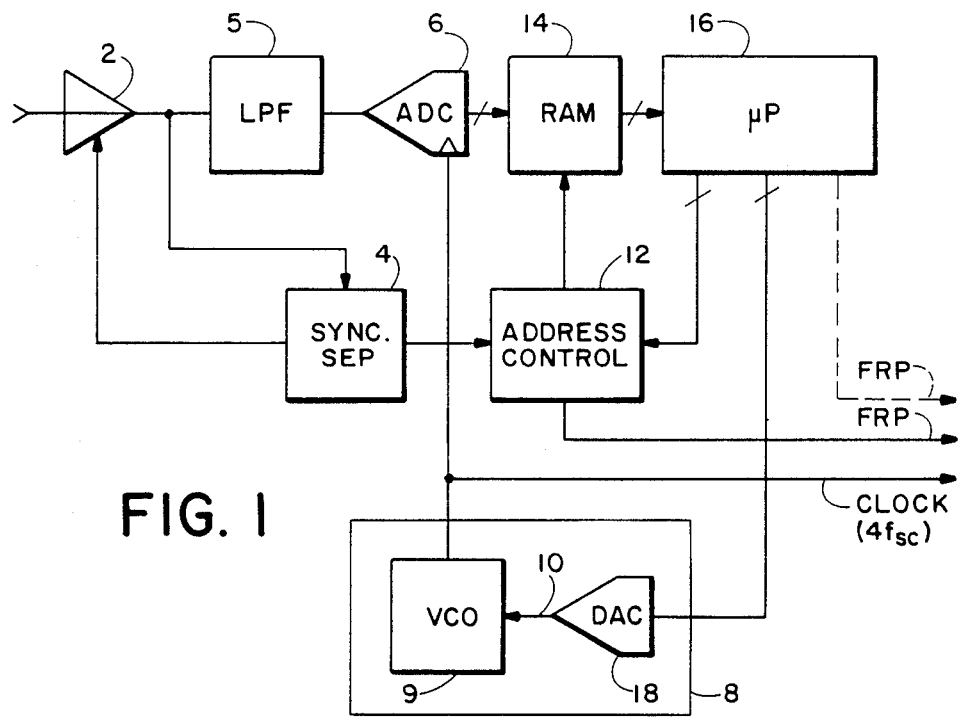
FIG. 1 is a block diagram of a genlock system embodying the present invention.

In the genlock system shown in FIG. 1, the input reference signal (which, depending on the application, may be black burst or composite program video) is applied to a clamp 2 which acts under control of a sync separator 4 to clamp the sync tip of the video signal to a predetermined potential level. The clamped video signal is bandwidth limited by a low-pass filter 5 and is applied to a six-bit ADC 6 which samples the video signal under control of a clock provided by a programmable oscillator 8 that comprises a VCO 9 and a digital-to-analog converter (DAC) 18. In the steady state, when the control word applied to the programmable oscillator is midrange, the clock frequency is four times the frequency of the burst of the input video signal and the clock is in phase with burst. A suitable dither function may be superimposed on the samples that are digitized, in order to increase the effective resolution of the ADC 6 beyond six bits.

The sync separator 4 also provides an output signal to an address control circuit 12. The address control circuit controls the addressing of a random access memory (RAM) 14, i.e. whether the RAM 14 can be written into by the ADC 6 or whether it can be read out from by a microprocessor 16.

Figure 2:
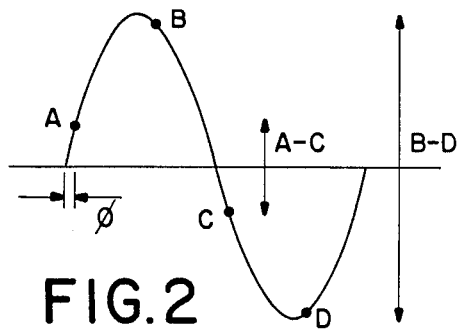
FIG. 2 illustrates one cycle of a sinusoidal waveform.
Figure 3:
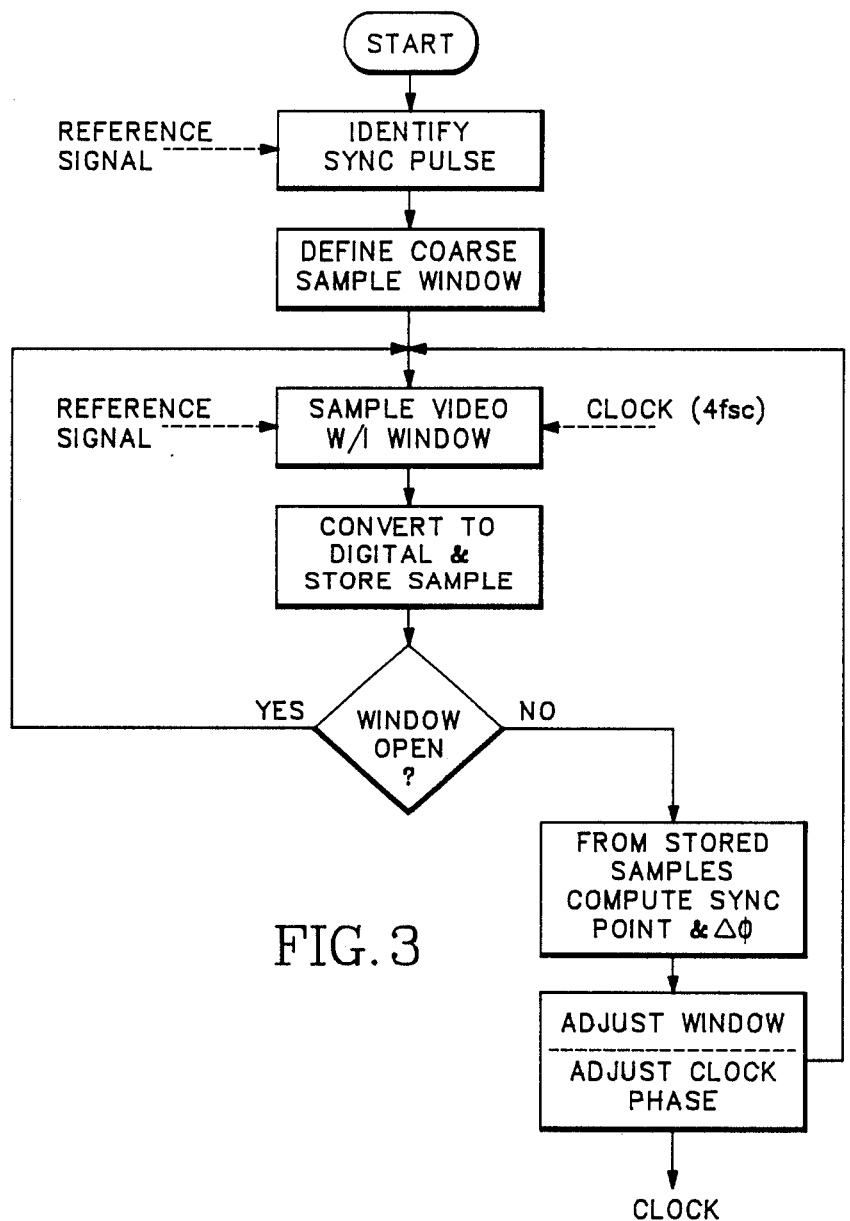
FIG. 3 is a flow chart of the genlock process of the present invention.

As in the case of a conventional analog genlock system, the purpose of the illustrated digital genlock system is to generate clock pulses at a predetermined frequency and in predetermined phase relationship with burst of the input reference signal. Referring now to FIGS. 2 and 3 prior to commencing acquisition, the processor contains no information concerning the location of burst, but without this information it is difficult to initially identify burst without examining the entire horizontal interval and consequently it is difficult to acquire lock. In order to alleviate this problem, when the sync separator 4 detects sync on a given line, it causes the address control to establish a write window for the RAM 14 during the next horizontal blanking interval. The sync separator may be of relatively simple design, since it is used only to aid in initial lock acquisition by setting the position of the write window relatively coarsely. Once lock has been acquired, the write window position is controlled with a high degree of precision by the microprocessor 16.

The delay between the sync pulse detected by the sync separator and the opening of the write window is slightly shorter than the horizontal line interval, and consequently the write window opens before the next sync pulse. The duration of the window is chosen to be such that the window does not close until after burst. Since sync occurs nineteen subcarrier cycles before the start of burst, and burst itself lasts nine cycles, this implies that the window must be open for at least about thirty subcarrier cycles.

During the write window, the six bit digital words representative of the amplitude of the clamped video signal at the sampling points established by the clock pulses from the oscillator 8 are written into the memory 14. When the window closes, the microprocessor 16 is able to address the memory 14 and carry out computations using the contents of the memory 14.

The microprocessor 16 carries out three principal operations, namely adjusting the position of the write window, adjusting the control word applied to the programmable oscillator 8, and measuring SC-H phase in order to enable the start of the four-field color sequence that constitutes a color frame to be identified.

The desired position of the write window depends upon the position of the sync point (the fifty percent point of the leading edge of the horizontal sync pulse) and is determined by averaging samples taken during the sync tip and samples taken during burst. Since burst is a sinusoidal wave, the average level of the signal during burst is equal to blanking level. By sampling burst over several cycles of burst, an accurate measure of blanking level can be obtained by averaging the samples. Thus, knowing that the leading edge of sync occurs nineteen subcarrier cycles prior to the start of burst, the processor can be caused to calculate the average value of the samples that occur from, say, 20 to 24 subcarrier cycles after sync. This number then represents blanking level. Similarly, knowing that the sync tip level is reached about 250 ns after the sync point and is maintained for about 4.25 $\mu$s, the processor can be caused to average the values of the samples during this interval and generate a number representing sync tip level. The average of the two numbers then represents the level of the sync point itself. The microprocessor examines the samples that occur on the leading edge of sync (since the input video is bandwidth limited, the slew rate of the leading edge of sync is sufficiently small that at least one sample is taken on the leading edge of sync both above and below the sync point) and determines which sample occurred immediately above the sync level and which sample occurred immediately below the sync level. The microprocessor then carries out a linear interpolation to determine the time, between these two samples, at which the level of the leading edge of sync was equal to the average of the blanking and sync tip levels, and this time is then taken as the sync time.

There is an unknown delay, which may exceed a half-period of burst, between sync time and the time at which the sync separator 4 provides a signal to the address control 12. During acquisition of lock, the microprocessor uses the information that it derives concerning sync time to control the position of the write window relative to sync, in order to provide correction for the error in sync time as determined by the sync separator. In addition, after lock has been acquired the microprocessor controls the position of the write window in order to compensate for drift in the sync point.

Thus, if sync occurs too soon after opening of the window, on the next line the window is opened somewhat earlier, and similarly if sync occurs an unduly long time after opening, the window is opened later. In fact, the microprocessor moves the window so that the window opens an integral number of subcarrier cycles before the first zero crossing of burst, and the information that is derived concerning sync time is used to ensure that the window does not open more than one subcarrier cycle, or four clock cycles, before sync. Thus, the window is positioned with respect to both sync and burst, with burst providing a fine control and sync providing a coarse control that is overridden by burst based on whether the SC-H phase angle lies within an acceptable range.

The microprocessor uses the samples that are taken during burst to calculate the phase of the clock relative to burst. It can be shown that if four samples are taken over one cycle of a sinusoidal waveform, and the values of the samples are represented by the numbers A, B, C and D (FIG. 2), then $\tan \phi = (A-C)/(B-D)$ where $\phi$ is the phase angle between the start of the sinusoidal waveform and the first sample. Therefore, $\phi = \tan^{-1}((A-C)/(B-D))$, and consequently by carrying out an arc tangent calculation the phase of the clock relative to burst can be determined.

In a conventional analog genlock system, the phase-locked loop brings the clock signal into quadrature with burst, i.e. it sets $\phi$ to 90 degrees. However, it may be desired that $\phi$ have a predetermined value $\phi_0$ other than 90 degrees. The microprocessor generates a control word representative of the difference between $\phi_0$ and $\phi$. This digital control word representing the value of the phase angle relative to the desired phase angle is applied by the microprocessor 16 to a digital-to-analog converter (DAC) 18, which is connected to the control input 10 of the VCO 9. Thus, if the clock is not in desired phase relationship with burst, the frequency of the VCO is adjusted to bring it into the desired phase relationship, and locking of the output of the VCO to burst is thereby accomplished.

The determination that is made concerning sync time is also used by the microprocessor to generate a frame reset pulse.

It is well known that in the NTSC system, the color frame is a four field sequence. Field 1 can be distinguished from field 2 based on vertical sync information, but in order to distinguish field 1 from field 3 it is necessary to consider SC-H phase. In a test signal generator, it is necessary to know when the four field sequence starts in order to insure that the test signal color framing matches the reference signal color framing.

In accordance with the EIA standard RS-170A, field 1 is characterized by the fact that a positive-going zero crossing of the extrapolated burst on line 10 coincides with the 50% point of horizontal sync. Accordingly, in order to determine which is field 1 it is necessary to know the interval that elapsed between the sync time and the closest positive-going zero crossing of the extrapolated burst. The sync time is known accurately from the above-mentioned interpolation between the two sample points that occur respectively before and after the sync time, and the times at which the positive-going zero crossings of burst occur can readily be deduced from the phase difference $\phi$ between the clock and burst. Thus, SC-H phase can be calculated and a determination can be made as to which of the odd-numbered fields is field 1. Upon determining which field is field 1, the microprocessor causes the address control 12 to generate a color frame reset pulse (FRP) in timed relationship to sync.

In carrying out an arc tangent calculation, it is conventional to calculate the sum of the mathematical series that defines the arc tangent. However, this calculation is quite time consuming and it is not necessary, in the case of the digital genlock system that is described, that the calculation be performed with the accuracy that is obtained by summing the series. Accordingly, an approximation is used, based on the observation that the tangent waveform is approximately linear from 0 to 45 degrees and is also approximately linear from 45 to 90 degrees. By this approximation, if the absolute value of (A−C) is greater than the absolute value of (B−D), the value of $\phi$ (the phase angle at which the sample A occurs) is taken from the following Table 1:

TABLE 1

| | | |
|---|---|---|
| A − C positive | B − D positive | $\phi = 45(B − D)/(A − C)$ |
| A − C positive | B − D negative | $\phi = 180 − 45(A − C)/(D − B)$ |
| A − C negative | B − D positive | $\phi = 360 − 45(C − A)/(B − D)$ |
| A − C negative | B − D negative | $\phi = 180 + 45(C − A)/(D − B)$ | whereas if the absolute value of (A−C) is less than the absolute value of (B−D) the value of $\phi$ is taken from the following Table 2:

TABLE 2

| | | |
|---|---|---|
| A − C positive | B − D positive | $\phi = 90 − 45(B − D)/(A − C)$ |
| A − C positive | B − D negative | $\phi = 90 + 45(D − B)/(A − C)$ |
| A − C negative | B − D positive | $\phi = 270 + 45(B − D)/(C − A)$ |
| A − C negative | B − D negative | $\phi = 270 − 45(D − B)/(C − A)$ |

It will, of course, be appreciated that the number of samples that occur between sync and the first sample in the sequence of four samples (the sample that yields the value A) is known.

It will be appreciated that the invention is not restricted to the particular genlock system that has been described and illustrated, and that variations may be made therein without departing from the scope of the invention as defined in the appended claims, and equivalents thereof. For example, although the invention has been described with reference to the NTSC system, it is also applicable to the PAL system, in which the eight-field color signal is defined similarly to the four-field NTSC color signal. The invention is not restricted to an apparatus and method by which lock is acquired to a component of the reference signal. For example, the programmable oscillator could be locked to a 3.58 MHz (or other frequency, such as 5.00 MHz) continuous wave signal. In this case, the burst of the reference signal would be examined at predetermined intervals to determine the phase relationship between burst and the clock signal generated by the programmable oscillator; and if the phase relationship were not as desired the phase of the clock signal would be adjusted relative to the continuous wave signal to achieve the desired relationship and lock would be re-established to the continuous wave signal. Moreover, the signal element of the input reference signal need not be part of burst but it could, even in the case of a video application, be some other element that repeats at line rate, such as horizontal sync. This is particularly applicable to the case where the reference signal is a monochrome signal and therefore does not include a burst component. In such a case, the programmable oscillator would be phase-locked to a continuous wave signal and a desired phase relationship would be established between the clock signals generated by the oscillator and the horizontal sync pulse. Linear interpolation is used to identify the sync point, because this provides acceptable results, but since the filter that is used for bandwidth limiting has a sin x/x impulse response, a more accurate determination would be provided if a sin x/x interpolation were done. It will also be appreciated that in order to avoid needing to use a fast ADC it would be possible to operate in equivalent time instead of peak time, taking successive samples on successive lines of the video signal. Moreover, the concept of a digital phase-locked loop is not, of course, restricted to video application.

We claim:

1. Apparatus for generating from an input analog signal having a signal element that repeats at a first frequency, a repetitive signal having a predetermined phase and frequency relationship with respect to the signal element of the input signal, said apparatus comprising:
   oscillator means for generating said repetitive signal at a frequency that depends on the value represented by a digital control signal applied to a control input of the oscillator means;
   an analog-to-digital converter for sampling the input analog signal under control of said repetitive signal, generating a succession of digital words representing the amplitudes of the successive samples;
   microprocessor means for digitally analyzing said succession of digital words including means for detecting a second signal element of the analog signal, said second signal element repeating at said first frequency, a memory for storing said succession of digital words, and means for allocating access to the memory in dependence on the time of occurrence of the second signal element such that the selected portion corresponds to said first and second signal elements and is processed by the analyzing means, and by subsequently determining the phase of said signal element relative to the repetitive signal before said signal element repeats and generating said digital control signal such that it is dependent on the phase of said signal element relative to the repetitive signal so as to bring the repetitive signal into said predetermined phase and frequency relationship with respect to said signal element.

2. A method of adjusting to a predetermined value $\phi_0$ the phase difference $\phi$ between a sinusoidal waveform signal and a clock pulse signal that occurs at a frequency equal to four times the frequency of the sinusoidal waveform signal, comprising sampling the sinusoidal waveform signal at first, second, third and fourth sample points, corresponding to four consecutive pulses of the clock pulse signal, determining the difference X between the value of the first sample and the value of the third sample, determining the difference Y between the value of the second sample and the value of the fourth sample, if the absolute value of X is greater than the absolute value of Y, taking the value of $\phi$ from the following Table A:

TABLE A

| | | |
|---|---|---|
| X positive | Y positive | $\phi = 45(X/Y)$ |
| X positive | Y negative | $\phi = 180 - 45(X/Y)$ |
| X negative | Y positive | $\phi = 360 - 45(X/Y)$ |
| X negative | Y negative | $\phi = 180 + 45(X/Y)$ | if the absolute value of Y is greater than the absolute value of X, taking the value of $\phi$ from the following Table B:

TABLE B

| | | |
|---|---|---|
| X positive | Y positive | $\phi = 90 - 45(Y/X)$ |
| X positive | Y negative | $\phi = 90 + 45(Y/X)$ |
| X negative | Y positive | $\phi = 270 + 45(Y/X)$ |
| X negative | Y negative | $\phi = 270 - 45(Y/X)$ | and adjusting the phase and frequency of at least one of said signals to eliminate the difference between $\phi$ and $\phi_0$.

3. A method of generating an electrical signal representative of SC-H phase of a composite video signal that includes a horizontal sync pulse and a color burst, comprising sampling the video signal under control of a clock having a frequency equal to an integral multiple of the burst frequency, determining which two samples were taken respectively next before and next after the sync point of the horizontal sync pulse, interpolating between said two samples to determine the value of a first angle, representative of the phase within the clock cycle at which the sync point occurred, determining the value of a second angle, representative of the phase within the subcarrier cycle at which a third sample was taken, and generating said electrical signal using the values of said first and second angles and the relationship between the clock frequency and the burst frequency.

4. A method according to claim 3, further comprising generating a color frame reference pulse in the event that the value of SC-H phase lies within a predetermined range.

5. A method according to claim 3, wherein the clock has a frequency equal to four times the burst frequency and the third sample is the first of four consecutive burst samples taken during the color burst of the video signal, and the value of the second angle is taken to be the arc tangent of the fraction having the value of the first burst sample minus the value of third burst sample as its numerator and the value of the second burst sample minus the value of the fourth burst sample as its denominator.

* * * * *